US010978524B2

(12) United States Patent
Gai et al.

(10) Patent No.: US 10,978,524 B2
(45) Date of Patent: Apr. 13, 2021

(54) ELECTROLUMINESCENT DISPLAY SUBSTRATE AND MANUFACTURING METHOD THEREOF, DISPLAY PANEL AND DISPLAY APPARATUS

(71) Applicant: BOE TECHNOLOGY GROUP CO., LTD., Beijing (CN)

(72) Inventors: Cuili Gai, Beijing (CN); Yi Cheng Lin, Beijing (CN); Pan Xu, Beijing (CN); Baoxia Zhang, Beijing (CN); Quanhu Li, Beijing (CN); Ling Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 192 days.

(21) Appl. No.: 16/308,537

(22) PCT Filed: May 22, 2018

(86) PCT No.: PCT/CN2018/087846
§ 371 (c)(1),
(2) Date: Dec. 10, 2018

(87) PCT Pub. No.: WO2019/033811
PCT Pub. Date: Feb. 21, 2019

(65) Prior Publication Data
US 2020/0258958 A1     Aug. 13, 2020

(30) Foreign Application Priority Data
Aug. 17, 2017   (CN) .......................... 201710705346.5

(51) Int. Cl.
*H01L 27/32*     (2006.01)
*H01L 21/56*     (2006.01)
(Continued)

(52) U.S. Cl.
CPC ........ *H01L 27/3246* (2013.01); *H01L 27/322* (2013.01); *H01L 27/3258* (2013.01);
(Continued)

(58) Field of Classification Search
CPC .............. H01L 27/322; H01L 27/3246; H01L 27/3258; H01L 27/3276; H01L 51/5225;
(Continued)

(56) References Cited

U.S. PATENT DOCUMENTS 9,685,634 B2 *   6/2017   Huangfu ............. H01L 27/3246
9,853,246 B2 *  12/2017   Kwon ................. H01L 51/0097
(Continued)

FOREIGN PATENT DOCUMENTS

CN        104471736 A     3/2015
CN        104733501 A     6/2015
(Continued)

OTHER PUBLICATIONS

Reza et al., "Stable RGBW AMOLED Display with OLED Degradation Compensation Using Electrical Feedback" 2010 IEEE International Solid-State Circuits Conference, 2010, pp. 118-120 (Year: 2010).*
(Continued)

*Primary Examiner* — Earl N Taylor
(74) *Attorney, Agent, or Firm* — Dilworth & Barrese, LLP.; Michael J. Musella, Esq.

(57) ABSTRACT

An electroluminescent display substrate and a manufacturing method thereof, a display panel and a display apparatus are disclosed. The electroluminescent display substrate includes: a base substrate including a display area and a peripheral area surrounding the display area, wherein at least one OLED device is in the display area; a pixel defining layer in the display area and the peripheral area; at least one groove in the pixel defining layer in the peripheral area;
(Continued)

wherein the at least one OLED device has a first electrode, the first electrode is on a side of the pixel defining layer away from the base substrate and extends to cover the groove.

18 Claims, 6 Drawing Sheets

(51) Int. Cl.
*H01L 51/52* (2006.01)
*H01L 51/56* (2006.01)

(52) U.S. Cl.
CPC ...... *H01L 27/3276* (2013.01); *H01L 51/5225* (2013.01); *H01L 51/5246* (2013.01); *H01L 51/5284* (2013.01); *H01L 51/56* (2013.01); *H01L 2227/323* (2013.01)

(58) Field of Classification Search
CPC .. H01L 51/5246; H01L 51/5284; H01L 51/56
See application file for complete search history.

(56) References Cited

U.S. PATENT DOCUMENTS

| | | | |
|---|---|---|---|
| 9,893,316 B2 * | 2/2018 | Furuie | H01L 51/5206 |
| 10,141,542 B2 * | 11/2018 | Furuie | H01L 51/5253 |
| 2004/0263740 A1 * | 12/2004 | Sakakura | H05B 33/04 349/138 |
| 2006/0097263 A1 * | 5/2006 | Lee | H01L 27/3246 257/72 |
| 2015/0060823 A1 * | 3/2015 | Furuie | H01L 27/3223 257/40 |
| 2015/0349293 A1 * | 12/2015 | Park | H01L 51/524 257/40 |
| 2016/0211483 A1 * | 7/2016 | Kwon | H01L 27/3276 |
| 2017/0012243 A1 * | 1/2017 | Suzuki | H01L 51/5259 |
| 2017/0125738 A1 * | 5/2017 | Kim | H01L 51/5225 |
| 2017/0133594 A1 * | 5/2017 | Mimura | H01L 51/0018 |
| 2017/0194599 A1 * | 7/2017 | Furuie | H01L 51/5012 |
| 2018/0061906 A1 * | 3/2018 | Kim | H01L 27/326 |
| 2018/0083223 A1 * | 3/2018 | Saito | H01L 51/5246 |
| 2018/0097047 A1 * | 4/2018 | Jung | H01L 27/3248 |
| 2018/0114947 A1 * | 4/2018 | Kwon | H01L 27/3276 |
| 2019/0058159 A1 * | 2/2019 | Furuie | H01L 51/5246 |
| 2019/0189710 A1 * | 6/2019 | Lee | H01L 51/5225 |
| 2019/0312233 A1 * | 10/2019 | Kim | H01L 51/5275 |
| 2019/0348624 A1 * | 11/2019 | Kim | H01L 27/3258 |
| 2019/0393276 A1 * | 12/2019 | Kim | H01L 27/3216 |
| 2020/0258958 A1 * | 8/2020 | Gai | H01L 51/5246 |

FOREIGN PATENT DOCUMENTS

| | | | | |
|---|---|---|---|---|
| CN | 105322100 A | 2/2016 | | |
| CN | 106449702 A | 2/2017 | | |
| CN | 107017354 A | 8/2017 | | |
| EP | 3522230 A1 * | 8/2019 | ......... | H01L 51/5225 |

OTHER PUBLICATIONS

"Pentile matrix family" Wikipedia, May 16, 2019, Wikimedia Foundation.
International Search Report and Written Opinion dated Aug. 29, 2018.
First Chinese Office Action dated Aug. 1, 2019.

* cited by examiner

ELECTROLUMINESCENT DISPLAY SUBSTRATE AND MANUFACTURING METHOD THEREOF, DISPLAY PANEL AND DISPLAY APPARATUS

The present application claims priority to Chinese patent application No. 201710705346.5, filed on Aug. 17, 2017, the entire disclosure of which is incorporated herein by reference as part of the present application.

TECHNICAL FIELD

At least one embodiment of the present disclosure relates to an electroluminescent display substrate and a manufacturing method thereof, a display panel, and a display apparatus.

BACKGROUND

An organic light emitting diode (OLED) is an organic thin film electroluminescent device, which has attracted more and more attention, due to its advantages such as simple preparation process, low cost, low power consumption, high brightness, large viewing angle, high contrast and flexible display. As a new generation of display methods, OLED display apparatuses have begun to take the place of traditional liquid crystal display apparatuses, and been widely used in electronic apparatuses such as mobile phones, computers, full-color televisions, digital video cameras, and personal digital assistants.

OLED display technology is different from traditional liquid crystal display technology. An OLED device on an electroluminescent display substrate includes an anode, a cathode, and a light emitting layer disposed between the anode and the cathode. When a voltage is applied between the anode and the cathode, holes and electrons move to the light emitting layer, and recombine in the light emitting layer. However, the cathode or anode in the OLED device is an active metal, which is very sensitive to water vapor and oxygen in the air, and is very likely to react with the water vapor or the oxygen having infiltrated from outside, resulting in deterioration of the electrode and affecting charge injection. In addition, the water vapor or the oxygen having infiltrated may also chemically react with organic light emitting materials in the light emitting layer, which will damage the organic light emitting materials, greatly reduce luminous efficiency of the organic light emitting materials, resulting in performance degradation and service life reduction of the OLED device.

SUMMARY

At least one embodiment of the present disclosure provides an electroluminescent display substrate, which includes: a base substrate including a display area and a peripheral area surrounding the display area, wherein at least one OLED device is in the display area; a pixel defining layer in the display area and the peripheral area; and at least one groove in the pixel defining layer in the peripheral area; wherein at least one OLED device has a first electrode, the first electrode is on a side of the pixel defining layer away from the base substrate and extends to cover the groove.

For example, in the electroluminescent display substrate provided by an embodiment of the present disclosure, the first electrode completely covers the groove.

For example, in the electroluminescent display substrate provided by an embodiment of the present disclosure, the at least one OLED device comprises a plurality of OLED devices provided in the display area, and the first electrode is a common cathode of the plurality of OLED devices.

For example, in the electroluminescent display substrate provided by an embodiment of the present disclosure, the groove penetrates through the pixel defining layer in a direction perpendicular to the electroluminescent display substrate.

For example, the electroluminescent display substrate provided by an embodiment of the present disclosure, further includes: an insulation layer in the display area and the peripheral area and between the pixel defining layer and the base substrate; wherein the insulation layer and the pixel defining layer are in contact with each other in the peripheral area, the groove includes a first portion penetrating through the pixel defining layer in a direction perpendicular to the electroluminescent display substrate and a second portion in the insulation layer.

For example, in the electroluminescent display substrate provided by an embodiment of the present disclosure, the second portion of the groove penetrates through the insulation layer in the direction perpendicular to the electroluminescent display substrate.

For example, in the electroluminescent display substrate provided by an embodiment of the present disclosure, a cross-sectional shape of the groove in a direction parallel to the electroluminescent display substrate includes at least one closed loop.

For example, in the electroluminescent display substrate provided by an embodiment of the present disclosure, the loop includes a rectangular loop or a rounded rectangular loop.

For example, in the electroluminescent display substrate provided by an embodiment of the present disclosure, a planar shape of the groove includes a straight strip, a curved strip or a wavy strip.

For example, the electroluminescent display substrate provided by an embodiment of the present disclosure, further includes: a first electrode lead located in the groove and electrically connected to the first electrode, wherein the at least one OLED device has a second electrode opposite to the first electrode, the first electrode lead and the second electrode are formed of a same material in a same layer.

For example, the electroluminescent display substrate provided by an embodiment of the present disclosure, further includes: a gate metal layer, a gate insulation layer and a source drain metal layer sequentially disposed on the base substrate; wherein the gate metal layer includes data line leads in the peripheral area, the source drain metal layer includes data lines in the peripheral area, the gate insulation layer has a plurality of via holes in the peripheral area to expose the data line leads, the plurality of via holes and the data lines are on a side of the groove facing the display area, the data line leads cross the groove and are electrically connected to the data lines through the plurality of via holes.

For example, the electroluminescent display substrate provided by an embodiment of the present disclosure, further includes: a first power line and a second power line in the peripheral area; wherein the first power line, the second power line and the gate metal layer are formed of a same material in a same layer; the data lines are in a fan-shaped arrangement upon crossing the second power line, so that the data lines extends outward to keep away from the first power line and the second power line, and a projection of parts of the data lines in the fan-shaped arrangement on the base substrate and a projection of the second power line on the base substrate are overlapped; the data lines are in a parallel arrangement upon crossing the first power line, the data lines are electrically connected to the data line leads through the plurality of via holes after crossing the first power line, and a projection of parts of the data lines in the parallel arrangement on the base substrate and a projection of the first power line on the base substrate are overlapped; the data line leads are in a fan-shaped arrangement upon crossing the groove, so that the data line leads can keep away from the first power line and the second power line, and a projection of parts of the data line leads in the fan-shaped arrangement on the base substrate and a projection of the groove on the base substrate are overlapped.

At least one embodiment of the present disclosure also provides a display panel, which includes: the display substrate provided by any one embodiment of the present disclosure; an opposite substrate disposed opposite to the display substrate and assembled with the display substrate; and a sealant bonding the display substrate and the opposite substrate together with each other; wherein the sealant is on a side of the groove away from the display area.

For example, the display panel provided by an embodiment of the present disclosure further includes: a first conductive layer on a side of the opposite substrate facing the display substrate; wherein the first electrode is electrically connected to the first conductive layer.

For example, the display panel provided by an embodiment of the present disclosure further includes: column spacers between the display substrate and the opposite substrate, and a second conductive layer covering the first conductive layer and the column spacers; wherein the first electrode is electrically connected to the first conductive layer through the second conductive layer.

At least one embodiment of the present disclosure also provides a display apparatus, which includes: the display panel provided by any one embodiment of the present disclosure.

At least one embodiment of the present disclosure also provides a manufacturing method of an electroluminescent display substrate, which includes: providing a base substrate, including a display area and a peripheral area surrounding the display area; forming at least one OLED device in the display area; forming a pixel defining layer in the display area and the peripheral area; forming at least one groove in the pixel defining layer in the peripheral area; wherein the at least one OLED device has a first electrode, the first electrode is on a side of the pixel defining layer away from the base substrate and extends to cover the groove.

For example, in the manufacturing method of an electroluminescent display substrate provided by an embodiment of the present, the groove penetrates through the pixel defining layer in a direction perpendicular to the electroluminescent display substrate.

For example, the manufacturing method of an electroluminescent display substrate provided by an embodiment of the present, further includes: forming an insulation layer in the display area and the peripheral area and between the pixel defining layer and the base substrate; wherein the insulation layer and the pixel defining layer are in contact with each other in the peripheral area, the groove includes a first portion penetrating through the pixel defining layer in a direction perpendicular to the electroluminescent display substrate and a second portion in the insulation layer.

For example, in the manufacturing method of an electroluminescent display substrate provided by an embodiment of the present, the second portion of the groove penetrates through the insulation layer in the direction perpendicular to the electroluminescent display substrate.

For example, the manufacturing method of an electroluminescent display substrate provided by an embodiment of the present, further includes: forming a first electrode lead, which is covered by the first electrode, in the groove; wherein the at least one OLED device has a second electrode opposite to the first electrode, the first electrode lead and the second electrode are formed by a same process.

For example, the manufacturing method of an electroluminescent display substrate provided by an embodiment of the present, further includes: forming a gate metal layer, a gate insulation layer and a source drain metal layer sequentially on the base substrate; wherein the gate metal layer includes data line leads, a first power line and a second power line in the peripheral area; the source drain metal layer includes data lines in the peripheral area; the gate insulation layer has a plurality of via holes in the peripheral area to expose the data line leads, the plurality of via holes and the data lines are on a side of the groove facing the display area; the data lines are in a fan-shaped arrangement upon crossing the second power line, so that the data lines extends outward to keep away from the first power line and the second power line, and a projection of parts of the data lines in the fan-shaped arrangement on the base substrate and a projection of the second power line on the base substrate are overlapped; the data lines are in a parallel arrangement upon crossing the first power line, the data lines are electrically connected to the data line leads through the plurality of via holes after crossing the first power line, and a projection of parts of the data lines in the parallel arrangement on the base substrate and a projection of the first power line on the base substrate are overlapped; the data line leads are in a fan-shaped arrangement upon crossing the groove, so that the data line leads can keep away from the first power line and the second power line, and a projection of parts of the data line leads in the fan-shaped arrangement on the base substrate and a projection of the groove on the base substrate are overlapped.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

REFERENCE NUMERALS

Figure 1:
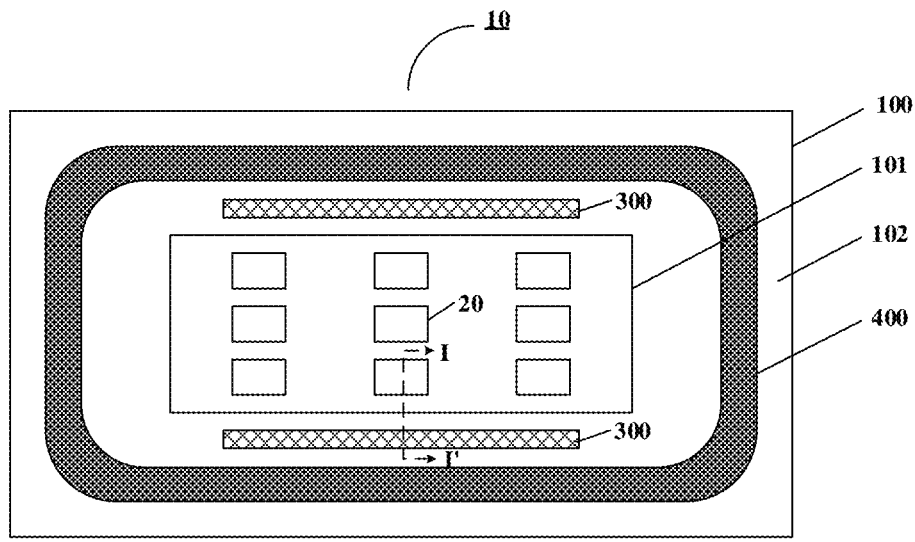
FIG. 1 is a top plan view of an electroluminescent substrate provided by an example of an embodiment of the present disclosure.

10—display substrate; 20—OLED device; 100—base substrate; 101—display area; 102—peripheral area; 300—groove; 400—sealant; 500—data drive circuit; 201—first electrode; 202—organic layer; 203—second electrode; 204—pixel defining layer; 205—insulation layer; 211—first electrode lead; 401—gate metal layer; 402—gate insulation layer; 403—source drain metal layer; 404—passivation layer; 411—gate electrode; 412—third electrode; 413—fourth electrode; 414—active layer; 415—first through-hole; 501—data line; 502—data line lead; 505—through-hole; 601—first fan-shaped arrangement; 602—second fan-shaped arrangement; 701—black matrix; 702—color filter; 703—planarization layer; 704—first conductive layer; 705—column spacer; 706—second conductive layer; VSS—first power line; VDD—second power line.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiments, without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not limited to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An light emitting layer and a metal electrode (cathode or anode) in an OLED device in an electroluminescent display substrate are very sensitive to water vapor and oxygen in the air, and is very likely to react with the water vapor or the oxygen infiltrated from outside, thus affecting performance and stability of a display panel including the electroluminescent display substrate. Therefore, the display panel needs to be sealed and to be provided with a waterproof design, so as to enhance protection of the OLED device inside the display panel.

At present, commonly used sealing techniques for OLED devices include ultraviolet (UV) curable sealing, frit laser sealing, face seal, desiccant sealing, Dam & Fill, and thin film sealing, etc. In a case where Dam & Fill is adopted, although a sealant is provided, the water vapor or the oxygen may still infiltrate into the internal sealed area through a gap between the sealant and the display substrate, and further infiltrate into the OLED devices along a pixel defining layer or other layer structures, thus causing damage to the OLED devices.

At least one embodiment of the present disclosure provides an electroluminescent display substrate, which includes: a base substrate including a display area and a peripheral area surrounding the display area, wherein at least one OLED device is in the display area; a pixel defining layer in the display area and the peripheral area; and at least one groove in the pixel defining layer in the peripheral area; wherein at least one OLED device has a first electrode, the first electrode is on a side of the pixel defining layer away from the base substrate and extends to cover the groove. At least one embodiment of the present disclosure also provides a manufacturing method of the electroluminescent display substrate, a display panel and a display apparatus.

The electroluminescent display substrate provided by the embodiments of the present disclosure can effectively reduce the oxygen and the water vapor that infiltrate into the OLED device, improve display performance and stability of the display panel including the electroluminescent display substrate, thus prolonging the service life of the display panel.

In the embodiments of the present disclosure, a patterning process may be a photolithographic patterning process, for example, including: coating a photoresist on a structural layer that need to be patterned, and coating the photoresist by spin coating, blade coating or roll coating; then, exposing the photoresist layer by using a mask, and developing the exposed photoresist layer to obtain a photoresist pattern; next, etching the structural layer by using the photoresist pattern, to form an expected patterned structure; finally, removing the photoresist pattern optionally.

Hereafter, the embodiments of the present disclosure and examples thereof will be described in detail below with reference to the accompanying drawings.

Figure 2:
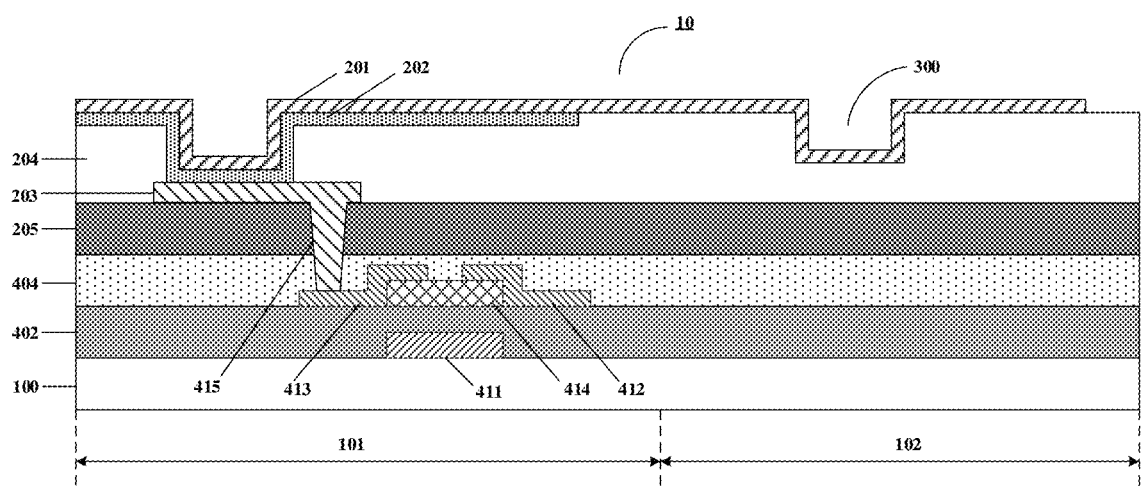
FIG. 2 is a cross-sectional view taken along line I-I' in FIG. 1.

An example of an embodiment of the present disclosure provides an electroluminescent substrate, as illustrated by FIG. 1 and FIG. 2 (FIG. 2 is a cross-sectional view taken along line I-I' in FIG. 1). The electroluminescent substrate 10 includes: a base substrate 100, wherein the base substrate 100 includes a display area 101 and a peripheral area 102 surrounding the display area 101. The display area 101 may also be referred to as an active area (AA).

For example, the base substrate 100 may be a glass substrate, and the embodiments of the present disclosure include but are not limited thereto.

For example, as illustrated by FIG. 1, at least one (for example, a plurality of) OLED device 20 may be disposed in the display area 101 for performing a display function, and the plurality of OLED devices can be arranged in an array. It should be note that, the number of the OLED device in FIG. 1 is merely illustrative, and the present disclosure is not limited thereto.

For example, as illustrated by FIG. 2, the OLED device 20 includes a first electrode 201, a second electrode 203 opposite to the first electrode 201, and an organic layer 202. The organic layer 202 is disposed between the first electrode 201 and the second electrode 203. For example, the first electrode 201 may be a common electrode, such as a common cathode, of the plurality of OLED devices, and the first electrode 201 of the plurality of OLED devices, as a common electrode, may be integrated.

For example, the first electrode 201 is a cathode, and the second electrode 203 is an anode. The first electrode 201 may be formed, for example, of a transparent conductive material having a high work function, and an electrode material thereof may include indium tin oxide (ITO), indium zinc oxide (IZO), etc.; the second electrode 203 may be formed, for example, of a material having high conductivity and a low work function, and an electrode material thereof may include an alloy such as a magnesium aluminum alloy (MgAl), a lithium aluminum alloy (LiAl), etc., or a single metal such as magnesium, aluminum, or lithium, etc.

The organic layer 202 may have a multi-layered structure. For example, the organic layer 202 may include a multi-layered structure formed by a hole injecting layer, a hole transporting layer, a light emitting layer, an electron transporting layer and an electron injecting layer. The organic layer 202 may further include a hole blocking layer and an electron blocking layer, wherein the hole blocking layer may be disposed, for example, between the electron transporting layer and the light emitting layer, the electron blocking layer may be disposed, for example, between the hole transporting layer and the light emitting layer. The arrangement and material of each layer in the organic layer 202 may be determined with reference to a general design, which is not limited by the embodiments of the present disclosure.

For example, as illustrated by FIG. 2, the electroluminescent substrate 10 includes a pixel defining layer 204 disposed in the display area 101 and the peripheral area 102. For example, the pixel defining layer 204 is configured to define sub-pixel regions. For example, at least the light emitting layer in the organic layer 202 is correspondingly disposed in opening regions of the pixel defining layer 204.

The pixel defining layer 204 extends from the display area 101 into the peripheral area 102, and at least one groove 300 is disposed in the pixel defining layer in the peripheral area. As illustrated by FIG. 1, two grooves 300 respectively provided on both sides are shown, which is merely illustrative, and included but not limited thereto in the embodiments of the present disclosure. For example, only one groove may be provided, or, for example, three or four or more grooves may be provided, which is not limited by the embodiments of the present disclosure.

For example, as illustrated by FIG. 2, the first electrode 201 is disposed on a side of the pixel defining layer 204 away from the base substrate 100, and the first electrode 201 extends from the display area 101 into the peripheral area 102 and covers the groove 300.

It should be noted that, in the embodiments of the present disclosure, the first electrode 201 may cover only a portion of the groove 300, or as illustrated by FIG. 2, the first electrode 201 completely covers the groove 300, and the embodiments of the present disclosure are not limited thereto.

In the present example, by disposing the groove in the pixel defining layer in the peripheral area and covering the groove with the first electrode, a barrier of a certain height can be formed in the pixel defining layer, thus effectively preventing the oxygen, the water vapor, etc. from infiltrating into the OLED device through the pixel defining layer.

It should be noted that the OLED device 20 can employ active matrix driving or passive matrix driving. A passive matrix driving electroluminescent display substrate is composed of a cathode and an anode, wherein an intersection of the anode and the cathode can emit light, a driving circuit can be externally mounted by a connection method such as tape carrier package (TCP) or chip on glass (COG), etc. An active matrix driving electroluminescent display substrate can be provided with a thin film transistor having a switching function (switching transistor), a thin film transistor having a driving function (driving transistor), and a charge storage capacitor, that is, a 2T1C driving circuit, for each pixel, and a peripheral driving circuit together with the OLED device can be integrated on a same glass substrate. In the embodiment shown in FIG. 2, the passive matrix driving is employed, wherein the driving circuit includes the driving transistor, the driving transistor is disposed in the display area 101, and the driving transistor can work as a driving component of the OLED device 20 to connect the OLED device 20 to a power source. In other examples, according to requirements, the driving circuit may further include a compensation circuit, a monitoring circuit, etc., so as to achieve a more stable and more accurate driving.

For example, as illustrated by FIG. 2, the driving transistor may include a gate electrode 411, a gate insulation layer 402, an active layer 414, a third electrode 412 and a fourth electrode 413; a first via hole 415 exposes the fourth electrode 413, and the second electrode 203 is electrically connected to the fourth electrode 413 through the first via hole 415. For example, the third electrode 412 may be a source electrode or a drain electrode, and correspondingly the fourth electrode 413 may be a drain electrode or a source electrode.

It should be noted that, the term "penetrate" which is used in the embodiments, refers to penetrating in a direction perpendicular to the electroluminescent display substrate. In the following embodiments, it is the same as the description herein, which will not be described repeatedly.

It should be noted that, the groove 300 disposed in the pixel defining layer in the peripheral area, may not penetrate through the pixel defining layer 204, or, of course, may penetrate through the pixel defining layer 204, which is not limited by the embodiments of the present disclosure.

Figure 3:
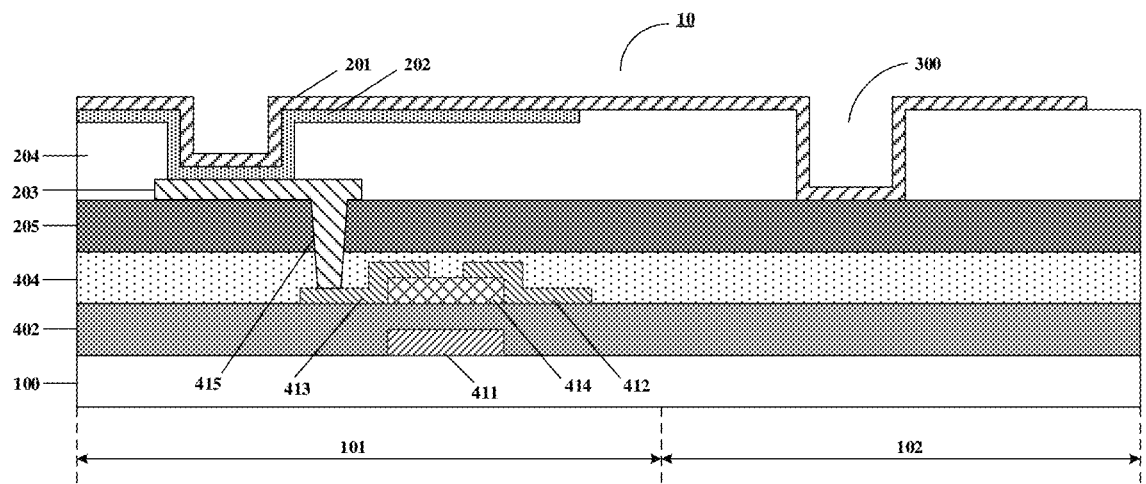
FIG. 3 is a cross-sectional view of an electroluminescent substrate provided by another example of an embodiment of the present disclosure.

For example, in an electroluminescent display substrate provided by another example of the embodiment of the present disclosure, as illustrated by FIG. 3, the groove 300 penetrates through the pixel defining layer 204. Compared with the previous example, the groove 300 penetrates through the pixel defining layer 204, which can prevent the oxygen, the water vapor, etc. from infiltrating into the OLED device through the defining layer 204 more effectively.

Figure 4:
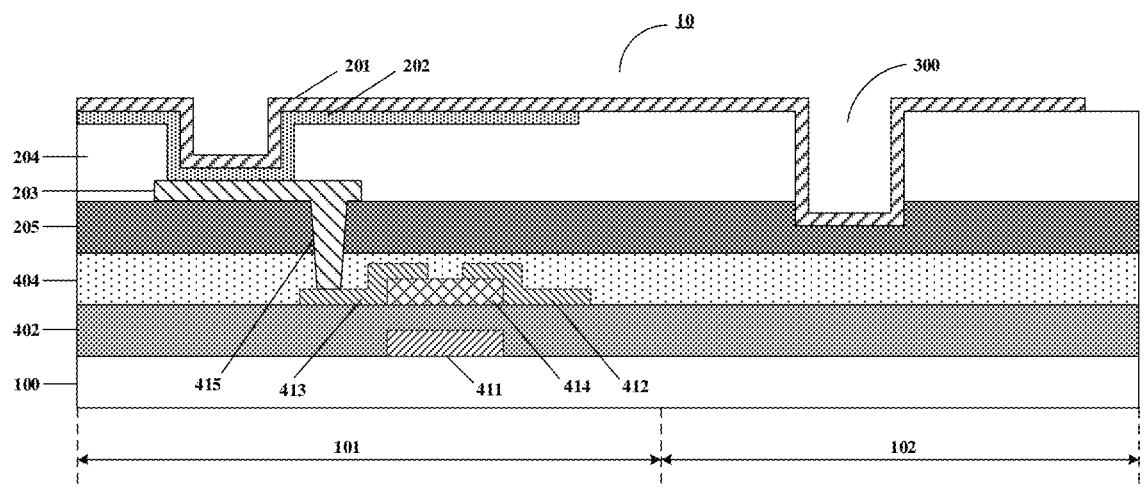
FIG. 4 is a cross-sectional view of an electroluminescent substrate provided by still another example of an embodiment of the present disclosure.

For example, in an electroluminescent display substrate provided by still another example of the embodiment of the present disclosure, as illustrated by FIG. 4, the OLED array substrate 10 further includes an insulation layer 205 disposed between the pixel defining layer 204 and the base substrate 100. The insulation layer 205 extends from the display area 101 into the peripheral area 102 and is in contact with the pixel defining layer 204 in the peripheral area 102. The groove 300 includes a first portion penetrating through the pixel defining layer 204 and a second portion disposed in the insulation layer 205. Likewise, the first electrode 201 extends from the display area 101 into the peripheral area 102 and covers the groove 300.

Compared with the previous example, in addition to penetrating through the pixel definition layer, the groove 300 further includes the second portion disposed in the insulation layer 205, so that a barrier of a certain height can also be formed in the insulation layer 205. The groove can not only effectively prevent the oxygen, the water vapor, etc. from infiltrating into the OLED device through the pixel defining layer 204, but also effectively prevent the oxygen, the water vapor, etc. from infiltrating into the OLED device through the insulation layer 205.

It should be noted that, the second portion of the groove 300 disposed in the insulation layer 205, may not penetrate through the insulation layer 205, or, of course, may penetrate through the insulation layer 205, and the embodiments of the present disclosure are not limited thereto.

Figure 5:
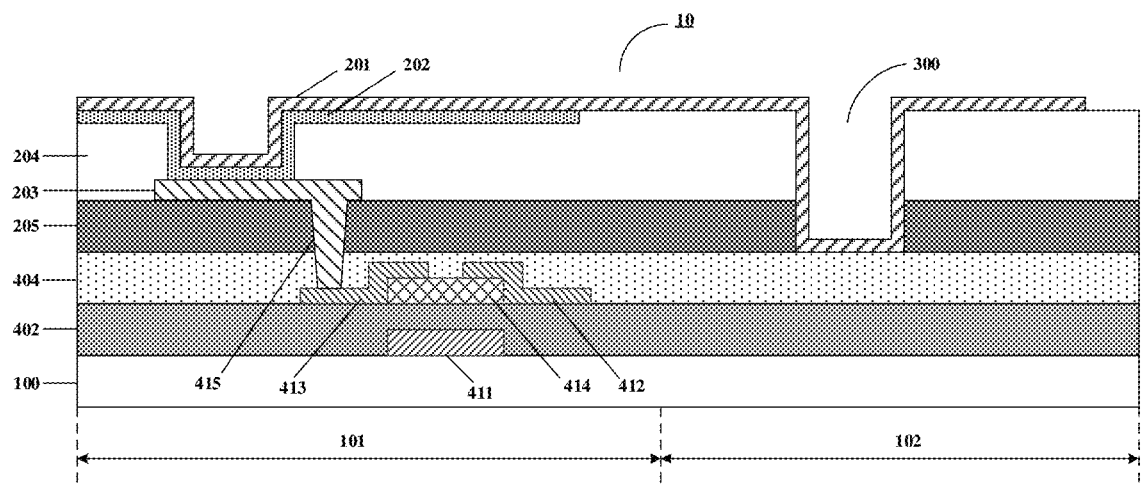
FIG. 5 is a cross-sectional view of an electroluminescent substrate provided by still another example of an embodiment of the present disclosure.

For example, in an electroluminescent display substrate provided by still another example of the embodiment of the present disclosure, as illustrated by FIG. 5, the second portion of the groove 300 disposed in the insulation layer 205 penetrates through the insulation layer 205, that is, the groove 300 penetrates through both the pixel defining layer 204 and the insulation layer 205. Compared with the previous example, the electroluminescent display substrate provided by the present example can prevent the oxygen, the water vapor, etc. from infiltrating into the OLED device through the defining layer 204 or the insulation layer 205, more effectively.

Hereinafter, a cross-sectional shape of the groove 300 in the aforementioned examples will be described. In the embodiments of the present disclosure, the cross-sectional shape of the groove 300 refers to a cross-sectional shape of the groove 300 in a direction parallel to the electroluminescent display substrate 10. In the following embodiments, it is the same as the description herein, which will not be omitted herein.

Figure 6:
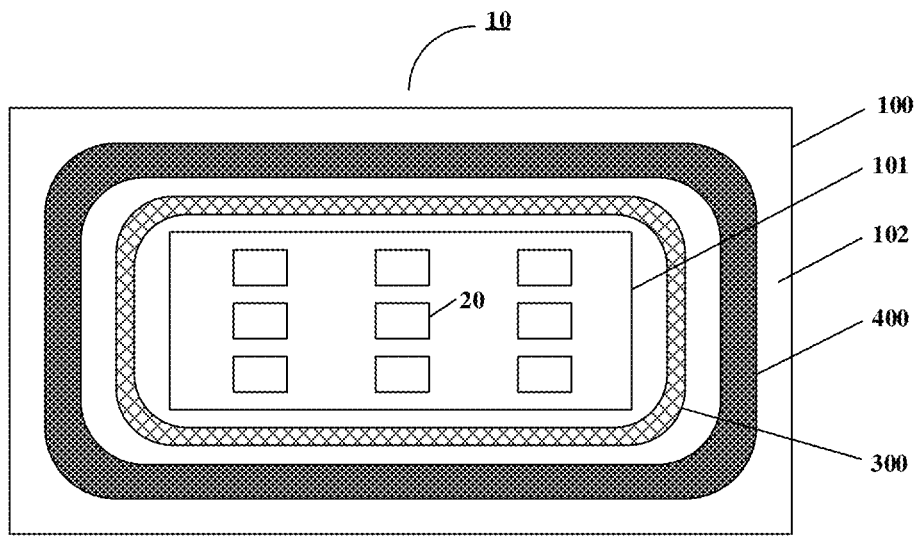
FIG. 6 is a schematic view 1 of a groove in an embodiment of the present disclosure.
Figure 7:
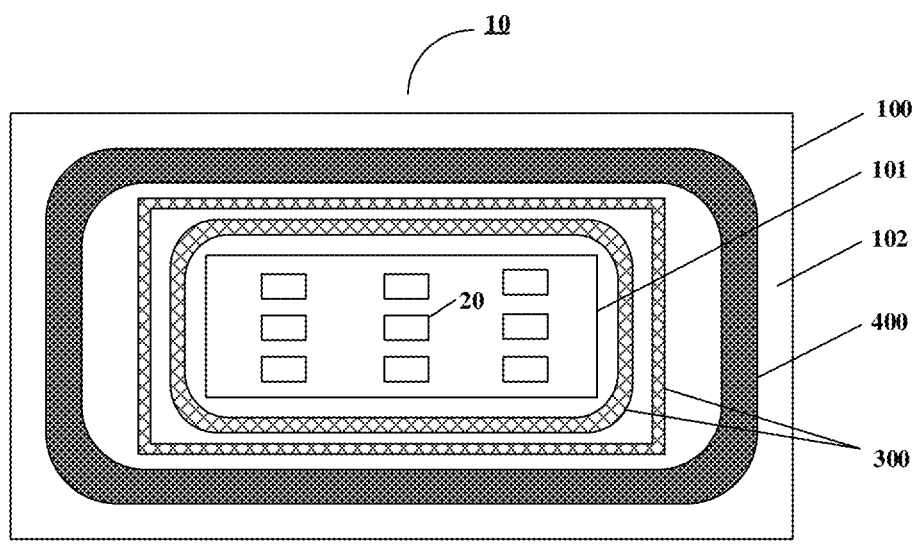
FIG. 7 is a schematic view 2 of a groove in an embodiment of the present disclosure.

In at least one embodiment of the present disclosure, for example, as illustrated by FIG. 6, the groove 300 may be disposed around the peripheral area 102 and form a closed loop. The shape of the groove 300 includes at least one closed loop, for example, as illustrated by FIG. 6, a groove having a shape of a closed loop may be disposed in the peripheral area 102, or, for example, as illustrated by FIG. 7, two grooves, each having a shape of a closed loop, may be disposed in the peripheral area 102. It should be noted that, the number of the groove having a shape of a closed loop is not limited by the embodiments of the present disclosure, as long as there is sufficient space in the peripheral area for disposing the grooves.

Compared with the unclosed groove shown in FIG. 1, in an electroluminescent display substrate provided by the embodiments of the present disclosure, grooves are disposed around in the peripheral area and form a closed loop, which is equivalent to forming an looped barrier around the display area, thus preventing the oxygen, the water vapor, etc. from infiltrating into the OLED device through the defining layer or the insulation layer, more effectively. It is easy to be understood that, in the case of space requirements (for example, the width of the frame) are satisfied, the more the number of the looped grooves is, the better the preventing effect is.

For example, as illustrated by FIG. 7, the cross-sectional shape of the looped groove includes a rectangular loop or a rounded rectangular loop. It should be noted that, the embodiments of the present disclosure include but are not limited thereto, and the cross-sectional shape of the looped groove may also be any other irregular loop, as long as the loop is disposed in the peripheral area and surrounds the display area.

Figure 8:
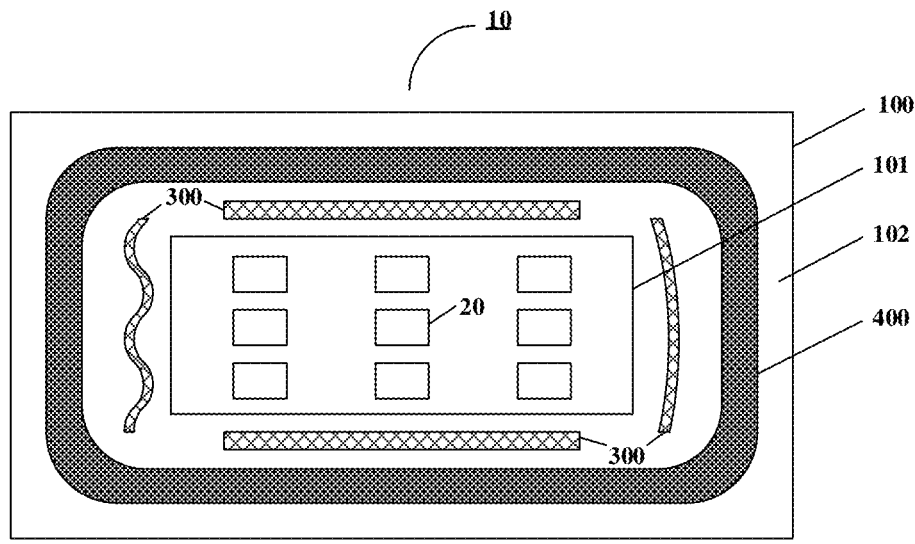
FIG. 8 is a schematic view 3 of a groove in an embodiment of the present disclosure

For another example, as illustrated by FIG. 8, a planar shape of the groove 300 includes a straight strip, a curved strip or a wavy strip. The embodiments of the present disclosure include but are not limited thereto, and the planar shape of the groove may also be any other shape, for example, a planar shape formed by a combination of various planar shapes. Of course, four grooves 300 as illustrated by FIG. 8 may also be joined end to end to form an irregular loop. It should be noted that, in the embodiments of the present disclosure, the planar shape of the groove 300 refers to a shape formed by extending direction of the groove 300, upon the electroluminescent display substrate 10 being overlooked.

It should be noted that, the grooves 300 shown in FIG. 1, FIG. 6, FIGS. 7 and FIG. 8, are merely illustrative, and the sizes and dimensions thereof are not in a real scale. In addition, in case of no conflict, features of the groove in the present disclosure can be combined to obtain a new embodiment regarding the groove, which is not limited by the present disclosure.

Besides, it should be noted that, in FIG. 1, FIG. 6, FIG. 7, and FIG. 8, a sealant 400 is further disposed outside the groove 300. The sealant 400 will be described below, and details will be omitted herein.

Figure 9A:
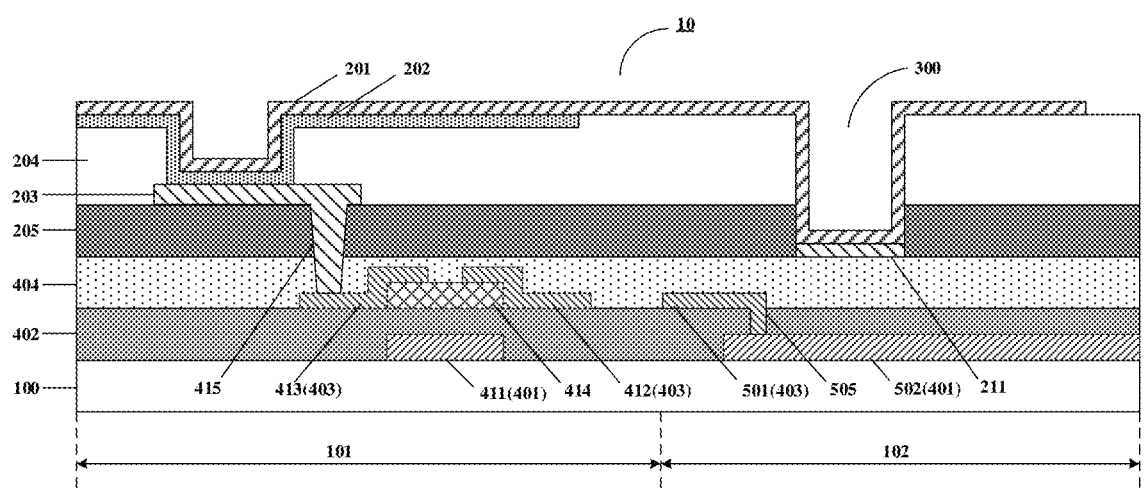
FIG. 9A is a cross-sectional view of another electroluminescent display substrate provided by an embodiment of the present disclosure.

In at least one embodiment of the present disclosure, for example, as illustrated by FIG. 9A, the electroluminescent display substrate 10 further includes a first electrode lead 211, which is disposed in the groove 300 and electrically connected to the first electrode 201. For example, the first electrode lead 211 may contact the first electrode 201 directly, and the first electrode lead 211 can lead out the common first electrode 201 of OLED devices to connect to a first power line which is described hereinafter. For example, an electrical connection can be achieved between the first electrode lead and the first power line by providing a via hole (not shown).

For example, as illustrated by FIG. 9A, as described above, the OLED device has a second electrode 203 opposite to the first electrode 201. For example, the first electrode lead 211 and the second electrode 203 can be formed of a same material in a same layer.

It should be noted that, in the present disclosure, "formed in a same layer" refers to being formed of a same material by a same patterning process, but a plurality of structures formed are not necessarily in a same layer in physical space.

In addition, the first electrode lead 211 does not need to be disposed in all places of the groove 300, and only need to be disposed in part of the groove to lead out the first electrode 201.

In the embodiments of the present disclosure, the first electrode lead 211 and the second electrode 203 can be formed by a same patterning process, thus saving process costs and mask costs.

In at least one embodiment of the present disclosure, for example, as illustrated by FIG. 9A, the electroluminescent display substrate 10 further includes a gate metal layer 401, a gate insulation layer 402 and a source drain metal layer 403 that are sequentially disposed on the base substrate 100.

For example, the gate metal layer 401 includes data line leads 502 disposed in the peripheral area 102, in addition to the gate electrode 411 of the driving transistor described above. Namely, the gate electrode 411 and the data line leads 502 can be formed simultaneously by a same patterning process.

For example, the source drain metal layer 403 includes data lines 501 disposed in the peripheral area, in addition to the third electrode 412 and the fourth electrode 413 of the driving transistor described above. Namely, the third electrode 412, the fourth electrode 413 and the data lines can be formed simultaneously by a same patterning process.

Figure 10:
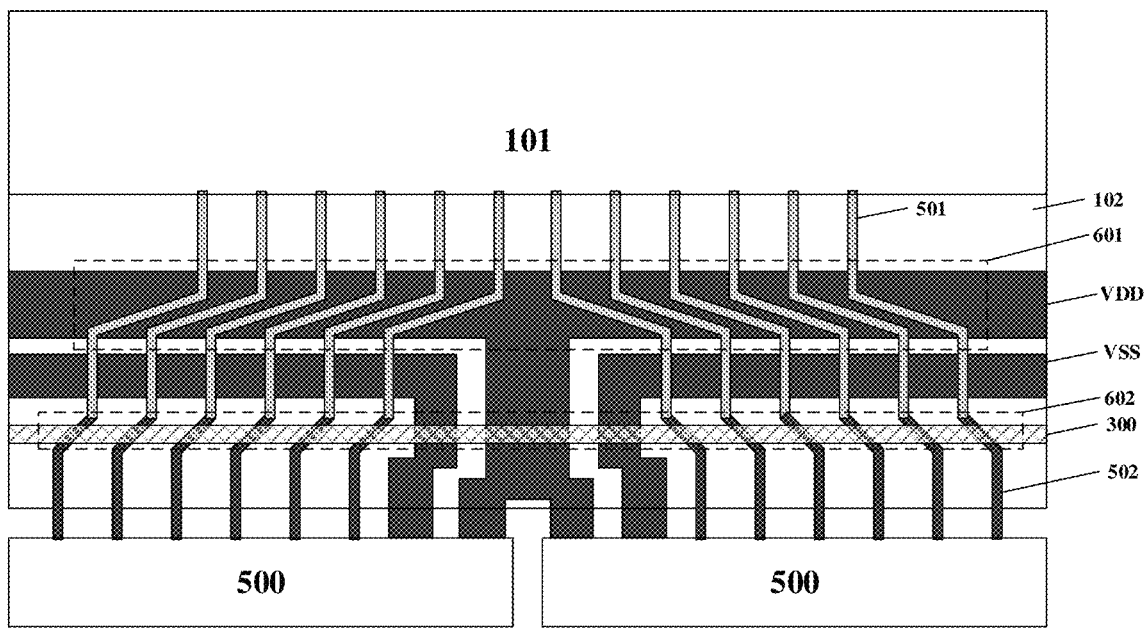
FIG. 10 is a top plan view of a data driving side of a display substrate provided by an embodiment of the present disclosure.

For example, as illustrated by FIG. 9A and FIG. 10 (FIG. 10 is a top plan view of a data driving side of the display substrate 10), the gate insulation layer 402 has at least one via hole (for example, a plurality of via holes) exposing the data line leads in the peripheral area 102. The data lines 501 disposed in the source drain metal layer 403 can be routed to the data line leads 502 disposed in the gate metal layer 401 through the via holes 505.

It should be noted that, because FIG. 9A is a partial cross-sectional view, only one via hole 505 is shown. As can be seen in FIG. 10, a plurality of data lines 501 and a plurality of data line leads 502 corresponding thereto are located in different layers, and can be connected through via holes. As FIG. 10 is a top plan view, the via holes are covered by the data lines 501, so the via holes are not shown in FIG. 10.

Besides, 12 data lines 501 and corresponding data line leads 502 are shown in FIG. 10. Herein the number of the data lines 501 and the number of the data line leads 502 are merely illustrative, which are not limited by the embodiment of the present disclosure.

For example, as illustrated by FIG. 9A and FIG. 10, a plurality of via holes 505 and the data lines 501 are disposed on a side of the groove 300 facing the display area 101, and the data line leads 502 are electrically connected to the data lines 501 through the via holes 505 after crossing the groove 300.

For example, the data line leads 502 can be connected to a data drive circuit 500, and the data lines 501 can be connected to an electrode (for example, a source electrode or a drain electrode) of a switching transistor, so as to control each OLED device in the display substrate.

It should be noted that, in the embodiments of the present disclosure, the data lines 501 refer to data lines disposed in the source drain metal layer 403 in the peripheral area 102. It is easy to be understood that data lines are also usually disposed in the display area, but the data lines 501 in the present disclosure don't include portions of the data lines disposed in the display area 101. The data line leads 502 refer to lead wires which are disposed in the gate metal layer 401 in the peripheral area 102 and can lead out the data lines 501.

It should be noted that, in the embodiments of the present disclosure, the term "cross" or "crossing" refers to intersecting and passing through as viewed from the projections on the base substrate, wherein physical structures may or may not be in contact with each other. For example, the data line leads crossing the groove, refers to that as viewed from projections of the data line leads and the groove on the base substrate, the projection of the data line leads intersects with the projection of the groove, and the projection of the data line leads extends through the projection of the groove. For another example, the data lines crossing a second power line refers to that as viewed from projections of the data lines and the second power line on the base substrate, the projection of the data lines intersects with the projection of the second power line, and the projection of the data lines extends through the projection of the second power line.

For example, as illustrated by FIG. 9A, the display substrate further includes a passivation layer 404, which covers the source drain metal layer 403 for isolation or protection.

Figure 9B:
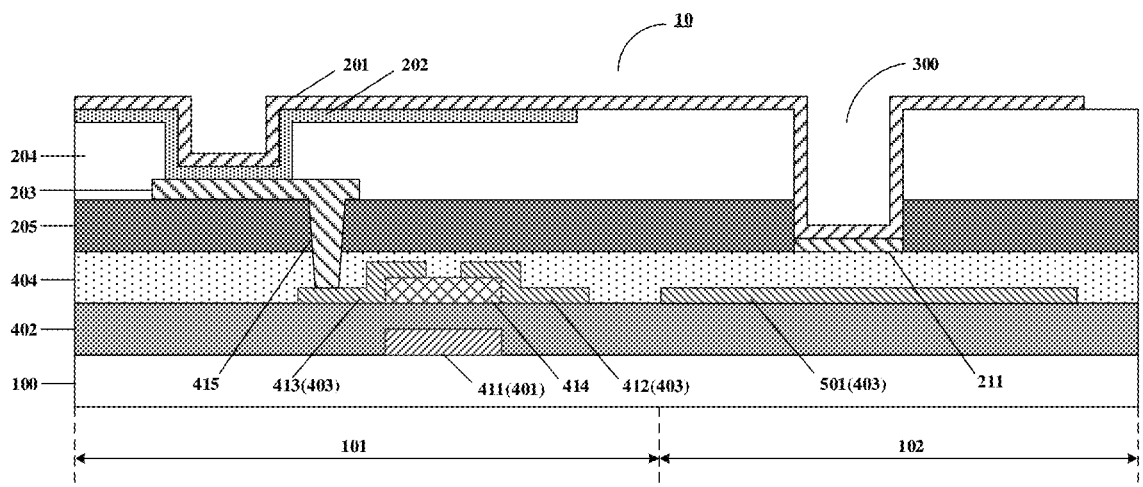
FIG. 9B is a cross-sectional view of the electroluminescent display substrate without data line leads provided by FIG. 9A.

For example, as illustrated by FIG. 9B, upon the groove 300 penetrating through the pixel defining layer 204 and the insulation layer 205, if the data line 501 of the source drain metal layer 403 is not routed to the data line lead 502 of the gate metal layer 401 through the via hole 505, the first electrode 201 located at the groove 300 is separated from the data line 501 by just an insulating passivation layer 404.

In the embodiments of the present disclosure, as illustrated by FIG. 9A, the data line 501 disposed in the source drain metal layer 403 is routed to the data line lead 502 disposed in the gate metal layer 401 through the via hole 505, and the data line lead 502 lead out the data line 501, so that the first electrode 201 located at the groove 300 and the data line lead 502 are separated by a two-layer insulating structure of the passivation layer 404 and the gate insulation layer 402, thus avoiding a risk of short circuit between the first electrode 201 and the data line lead 502 more effectively.

In at least one embodiment of the present disclosure, for example, as illustrated by FIG. 10, the electroluminescent display substrate further includes a first power line VSS and a second power line VDD, which are disposed in the peripheral area 102. For example, one end of the first power line VSS is connected to the data drive circuit 500, and the other end thereof is connected to the first electrode lead 211 described above, thus supplying a voltage signal to the first electrode 201 directly or indirectly. For example, one end of the second power line VDD is connected to the data drive circuit 500, and the other end thereof is connected to one electrode (for example, a source electrode or a drain electrode) of the driving transistor described above, thus supplying a drive voltage to the driving transistor directly or indirectly.

For example, the first power line VSS and the second power line VDD are formed of a same material in a same layer, that is, the first power line VSS and the second power line VDD are formed at the same time with the gate metal layer 401 by a same patterning process.

For example, as illustrated by FIG. 10, a data drive circuit 500 is disposed respectively on the left half and the right half of the display substrate, for supplying voltage signal to the data line lead 502, the first power line VSS and the second power line VDD.

As illustrated by FIG. 10, the data lines 501 are led out along a vertical direction from the display area 101, the direction along which the data lines 501 are led out from the display area 101 is referred to as a first direction, and a direction perpendicular to the first direction is referred to as a second direction. For example, the second power line VDD includes a portion extending along the second direction and a portion extending along the first direction, wherein one end of the portion extending along the first direction is split into two traces, the two traces are connected to the data drive circuits 500 on the left half and the right half, respectively. The second power line VDD is connected to the two data drive circuits 500, thus promoting driving capability of the data drive circuits 500 for the second power line VDD.

For example, a first power line VSS is disposed respectively in the left half and the right half, the first power line VSS extends along a direction parallel to the direction along which the second power line extends, the first power line VSS includes a portion extending along the second direction and a portion extending along the first direction, wherein one end of the portion extending along the first direction is connected to the data drive circuit 500.

For example, the data lines 501 and the source drain metal layer 403 are formed of a same material in a same layer, that is, the data lines 501 are formed at the same time with the source drain metal layer 403 by a same patterning process. As illustrated by FIG. 10, after being led out from the display area 101, the data lines 501 are in a fan-shaped arrangement upon crossing the second power line VDD, which is referred to as a first fan-shaped arrangement 601, and a projection of the first fan-shaped arrangement 601 on the base substrate and a projection of the second power line VDD on the base substrate are overlapped. For example, after being led out from the display area 101, the data lines 501 firstly extend along the first direction, then a part of the data lines 501 extend to the lower left, and the other part of the data lines 501 extend to the lower right, that is, the data lines 501 extend outward in a diffused way, thus forming the first fan-shaped arrangement 601. Because the data lines 501 (data line leads 502), the first power line VSS and the second power line VDD are finally connected to the data drive circuit 500, disposing the first fan-shaped arrangement 601 can keep the data lines 501 away from a connection region of the first power line VSS and the data drive circuit 500 and a connection region of the second power line VDD and the data drive circuit 500.

For example, as illustrated by FIG. 10, after crossing the second power line VDD in the first fan-shaped arrangement, the data lines 501 crosses the first power line VSS in a parallel arrangement, wherein a projection the parallel arrangement on the base substrate and a projection of the first power line VSS on the base substrate are overlapped. Then the data lines 501 are electrically connected to the data line leads 502 through the via holes after crossing the first power line VSS, that is, the data lines 501 are routed to the data line leads through the via holes. The data line leads 502 and the gate metal layer 401 are formed of a same material in a same layer, that is, the data line leads 502 are formed at the same time with the gate metal layer 401 by a same patterning process. As can be seen from the above, the data line leads 502, the first power line VSS and the second power line VDD are disposed in the gate metal layer 401, while the data lines 501 are disposed in the source drain metal layer 403. For example, the gate insulation layer 402 are disposed between the gate metal layer 401 and the source drain metal layer 403, thus insulating the data lines 501 from the first power line VSS and the second power line VDD.

For example, as illustrated by FIG. 10, portions of the data line leads 502 crossing the groove 300 are in a fan-shaped arrangement, which is referred to as a second fan-shaped arrangement 602, and a projection of the second fan-shaped arrangement 602 on the base substrate and a projection of the groove 300 on the base substrate are overlapped. For example, after the data lines 501 are routed to the data line leads 502 through the via holes, similar to the first fan-shaped arrangement 601, a part of the data line leads 502 extend to the lower left, and the other part of the data line leads 502 extend to the lower right, that is, the data line leads 502 extend outward in a diffused way, thus forming the second fan-shaped arrangement 602. Disposing the second fan-shaped arrangement 602 can keep the data line leads 502 away from the connection region of the first power line VSS and the data drive circuit 500, so that the data line leads 502 are fanned out in a better way to be connected to the data drive circuit 500.

For example, as illustrated by FIG. 10, portions connecting the data line leads 502 to the data drive circuit 500, portions connecting the first power line VSS to the data drive circuit 500, and portions connecting the second power line VDD to the data drive circuit 500, are in a parallel distribution. For example, the data drive circuit 500 can include a plurality of electrode pins which are uniformly arranged, the data line leads 502, the first power line VSS and the second power line VDD can be electrically connected to the data drive circuit 500 through the electrode pins.

In the embodiments of the present disclosure, the first power line VSS and the second power line VDD are disposed in the gate metal layer, while the data lines ate disposed in the source drain metal layer, so the data lines are in a wire-climbing-surface design upon crossing the first power line VSS and the second power line VDD. Metal ramps are fewer in the wire-climbing-surface design, thus reducing a risk of short circuit between the two metal layers. At the same time, the two fan-shaped arrangement (the first fan-shaped arrangement and the second fan-shaped arrangement) can make the data lines be fanned out in a better way to be connected to the data drive circuit.

Figure 11:
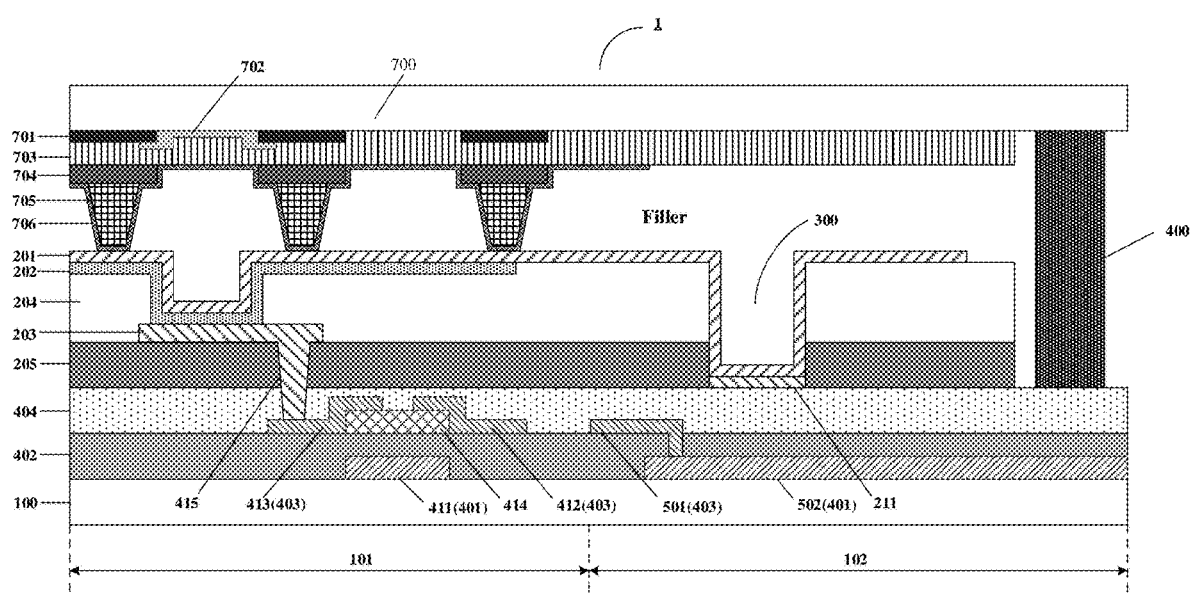
FIG. 11 is a cross-sectional view of a display panel provided by an embodiment of the present disclosure.

At least one embodiment of the present disclosure further provides a display panel. As illustrated by FIG. 11, the display panel 1 includes the display substrate provided by any one embodiment of the present disclosure, and an opposite substrate disposed opposite to the display substrate and assembled with the display substrate.

For example, a black matrix 701, a color filter 702 and a planarization layer 703 may be disposed on the opposite substrate 700.

For example, in a direction perpendicular to the display substrate, the color filter 702 is overlapped with an opening region defined by the pixel defining layer 204 in the OLED device, so that light emitted from the organic layer 202 (for example, white light) can be filtered by the color filter 702 to realize color display. For example, the color filter 702 may include three primary color filters, such as a red color filter, a blue color filter, or a green color filter. For example, the organic layer 202 can emit white light, which is filtered by the color filter 702 to obtain three primary colors, and then be the three primary colors are combined to realize the color display.

It should be noted that, in the embodiments of the present disclosure, a manner of color display is not limited to the aforementioned manner of color display. For example, the display panel provided by the embodiments can also realize color display by employing red, green and blue pixels to emit light independently; the display panel can also employ OLED devices to emit blue light, and then use the blue light to excite color conversion materials (for example, fluorescent material) to obtain red light and green light, so as to realize the color display. One of ordinary skill in the art should understand that in the embodiments of the present disclosure, the manner of illumination of the display panel is not limited to the aforementioned three manners, and neither is the specific color of the light that the display substrate emits.

For example, as illustrated by FIG. 11, the display panel 1 further includes a sealant 400 bonding the display substrate and the opposite substrate together with each other, and the sealant 400 is disposed on a side of the groove away from the display area 101. The sealant 400 has functions of preventing water vapor from infiltrating thereinto, maintaining a thickness of the peripheral cell gap of the display substrate, and bonding the display substrate and the opposite substrate.

For example, a liquid filler can also be filled in the gap between the display substrate and the opposite substrate. A combination of the filler and the sealant 400 (Dam & Fill) is a commonly used packaging process. For example, the filler may be a resin material.

In at least one embodiment of the present disclosure, for example, as illustrated by FIG. 11, the display panel 1 may further include column spacers 705 disposed between the display substrate and the opposite substrate. The column spacers 705 have a function of maintaining stability of, the gap between the display substrate and the opposite substrate, that is, the cell gap.

For example, a first conductive layer 704 and a second conductive layer 706 covering the first conductive layer 704 and the column spacers 705 may be disposed between the planarization layer 703 and the column spacers 705. For example, the first conductive layer 704 may be made of a metal material such as molybdenum, etc. For example, the second conductive layer may be a transparent conductive material such as indium tin oxide (ITO) or indium zinc oxide (IZO), etc. The first electrode 201 is electrically connected to the first conductive layer 704 through the second conductive layer 706. It should be noted that if the column spacers 705 themselves are made of a conductive material (for example, an anisotropic conductive material), the second conductive layer 706 may not be formed.

For example, in the case of that the display panel 1 employs a top emission mode, the first electrode 201 is made of a transparent conductive material such as indium tin oxide (ITO) or indium zinc oxide (IZO), etc. By providing the first conductive layer 704 and electrically connecting the first conductive layer 704 to the first electrode 201 through the second conductive layer 706, the first conductive layer 704 can serve as an auxiliary electrode of the first electrode 201, which can effectively reduce the voltage drop on the first electrode 201.

For example, as illustrated by FIG. 10, the display panel provided by the embodiment may further include the data drive circuit 500, and the data line leads 502 electrically connected to the data drive circuit 500. For example, the data drive circuit 500 may be a data drive chip that is bonded to the display panel, and the data line leads 502 nay be connected to the data drive chip may through a flexible circuit board.

It should be noted that, in the embodiments of the present disclosure, the driving transistor may be a thin film transistor having a bottom gate structure, or a thin film transistor having a top gate structure, which is not limited in the embodiments of the present disclosure. For example, in the embodiments shown in the accompanying drawings of the present disclosure, the driving transistor employs the thin film transistor having a bottom gate structure.

In addition, the OLED device may employ a top emission mode or a bottom emission mode, which is not limited in the embodiments of the present disclosure. For example, when the OLED device employs the top emission mode (as illustrated by FIG. 11), the first electrode 201 thereof is made of a transparent conductive material, such as indium tin oxide (ITO) or indium zinc oxide (IZO), etc., and the second electrode 203 thereof may be made of an opaque metal electrode. When the OLED device employs the bottom emission mode, the first electrode 201 may employ a reflective electrode, and the second electrode 203 may employ a translucent electrode.

The technical effects of the display panel provided by the embodiments of the present disclosure may be referred to the corresponding descriptions for the electroluminescent display substrate provided by the embodiments of the present disclosure, and details are not described herein again.

At least one embodiment of the present disclosure further provides a display apparatus, which includes the display panel provided by the embodiments of the present disclosure.

For example, the display apparatus may be any product or component having a display function, such as a mobile phone, a tablet computer, a television, a display device, a notebook computer, a digital photo frame, a navigator, etc.

The technical effects of the display apparatus provided by the embodiments of the present disclosure may be referred to the corresponding descriptions for the electroluminescent display substrate provided by the embodiments of the present disclosure, and details are not described herein again.

An embodiment of the present disclosure further provides a manufacturing method of an electroluminescent display substrate. In an example, as illustrated by FIG. 1 and FIG. 2 (FIG. 2 is a cross-sectional view taken along line I-I' in FIG. 1), the manufacturing method includes: providing a base substrate 100, which includes a display area 101 and a peripheral area 102 surrounding the display area 101. The display area 101 may also be referred to as an active area (AA).

For example, the base substrate 100 may be a glass substrate, and the embodiments of the present disclosure include but are not limited thereto.

For example, as illustrated by FIG. 1, the manufacturing method provided by the present example further includes forming at least one (for example, a plurality of) OLED device(s) 20 in the display area 101 for performing a display function, and the plurality of OLED devices can be arranged in an array. It should be note that, the number of the OLED device(s) in FIG. 1 is merely illustrative, and is not limited thereto in the present disclosure.

For example, as illustrated by FIG. 2, the OLED device 20 includes a first electrode 201, a second electrode 203 opposite to the first electrode 201, and an organic layer 202. The first electrode 201, the second electrode 203 and the organic layer 202 may be referred to the corresponding descriptions for the electroluminescent display substrate provided by the embodiments of the present disclosure, and details are not described herein again.

For example, as illustrated by FIG. 2, the manufacturing method provided by the present example further includes forming a pixel defining layer 204, wherein the pixel defining layer 204 extends from the display area 101 into the peripheral area 102.

For example, as illustrated by FIG. 2, the manufacturing method provided by the present example further includes forming at least one groove 300 in the pixel defining layer in the peripheral area. For example, the groove 300 can be formed by a photolithographic patterning process.

As illustrated by FIG. 1, two grooves 300 are shown, which is merely illustrative, and included but not limited thereto in the embodiments of the present disclosure. For example, only one groove may be provided, or, for example, three or four or more grooves may be provided, which is not limited by the embodiments of the present disclosure.

For example, as illustrated by FIG. 2, a common first electrode 201 of the OLED devices is disposed on a side of the pixel defining layer 204 away from the base substrate 100, and the first electrode 201 extends from the display area 101 into the peripheral area 102 and covers the groove 300.

It should be noted that, in the embodiments of the present disclosure, the first electrode 201 may cover only a portion of the groove 300, or as illustrated by FIG. 2, the first electrode 201 completely covers the groove 300, which is not limited by the embodiments of the present disclosure.

In the manufacturing method provided by the embodiments of the present disclosure, by forming the groove in the pixel defining layer in the peripheral area and covering the groove with the first electrode, a barrier of a certain height can be formed in the pixel defining layer, thus effectively preventing the oxygen, the water vapor, etc. from infiltrating into the OLED device through the pixel defining layer.

It should be noted that the OLED device 20 can employ active matrix driving or passive matrix driving. A passive matrix driving electroluminescent display substrate is composed of a cathode and an anode, wherein an intersection of the anode and the cathode can emit light, a driving circuit can be externally mounted by a connection method such as tape carrier package (TCP) or chip on glass (COG), etc. An active matrix driving electroluminescent display substrate can be provided with a thin film transistor having a switching function (switching transistor), a thin film transistor having a driving function (driving transistor), and a charge storage capacitor, that is, a 2T1C driving circuit, for each pixel, and a peripheral driving circuit together with the OLED device can be integrated on a same glass substrate. In the embodiment shown in FIG. 2, the passive matrix driving is employed, wherein the driving circuit includes the driving transistor, the driving transistor is disposed in the display area 101, and the driving transistor can work as a driving component of the OLED device 20 to connect the OLED device 20 to a power source. In other examples, according to requirements, the driving circuit may further include a compensation circuit, a monitoring circuit, etc., so as to achieve a more stable and more accurate driving.

For example, as illustrated by FIG. 2, the driving transistor may include a gate electrode 411, a gate insulation layer 402, an active layer 414, a third electrode 412 and a fourth electrode 413; a first via hole 415 exposes the fourth electrode 413, and the second electrode 203 is electrically connected to the fourth electrode 413 through the first via hole 415. For example, the third electrode 412 may be a source electrode or a drain electrode, and correspondingly the fourth electrode 413 may be a drain electrode or a source electrode.

It should be noted that, the term "penetrate" which is used in the embodiments, refers to penetrating in a direction perpendicular to the electroluminescent display substrate. In the following embodiments, it is the same as the description herein, which will not be described repeatedly.

For example, in the manufacturing method provided by another example, as illustrated by FIG. 3, the groove 300 penetrates through the pixel defining layer 204. For example, the groove can penetrate through the pixel defining layer 204 by adjusting an etching time. Compared with the example shown in FIG. 2, the groove 300 penetrates through the pixel defining layer 204, which can prevent the oxygen, the water vapor, etc. from infiltrating into the OLED device through the defining layer 204 more effectively.

For example, in the manufacturing method provided by still another example, as illustrated by FIG. 4, the manufacturing method further includes forming an insulation layer 205 between the pixel defining layer 204 and the base substrate 100. The insulation layer 205 extends from the display area 101 into the peripheral area 102 and is in contact with the pixel defining layer 204 in the peripheral area 102. The groove 300 includes a first portion penetrating through the pixel defining layer 204 and a second portion disposed in the insulation layer 205. Likewise, the first electrode 201 extends from the display area 101 into the peripheral area 102 and covers the groove 300.

Compared with the example shown in FIG. 3, in the manufacturing method provided by the present example, in addition to penetrating through the pixel definition layer, the groove 300 further includes the second portion disposed in the insulation layer 205, so that a barrier of a certain height can also be formed in the insulation layer 205. The groove can not only effectively prevent the oxygen, the water vapor, etc. from infiltrating into the OLED device through the pixel defining layer 204, but also effectively prevent the oxygen, the water vapor, etc. from infiltrating into the OLED device through the insulation layer 205.

It should be noted that, the second portion of the groove 300 disposed in the insulation layer 205, may not penetrate through the insulation layer 205, or, of course, may penetrate through the insulation layer 205, which is not limited by the embodiments of the present disclosure.

For example, in the manufacturing method provided by still another example, as illustrated by FIG. 5, the second portion of the groove formed in the insulation layer 205 penetrates through the insulation layer 205, that is, the groove 300 penetrates through both the pixel defining layer 204 and the insulation layer 205. Compared with the example shown in FIG. 4, the electroluminescent display substrate manufactured by the manufacturing method provided by the present example can prevent the oxygen, the water vapor, etc. from infiltrating into the OLED device through the defining layer 204 or the insulation layer 205, more effectively.

Descriptions for a cross-sectional shape and a planar shape of the groove 300 in the aforementioned examples may be referred to the corresponding descriptions for the electroluminescent display substrate provided by the embodiments of the present disclosure, and details are not described herein again.

At least one embodiment of the present disclosure further provides a manufacturing method of an electroluminescent display substrate, for example, as illustrated by FIG. 9A, the manufacturing method further includes forming a first electrode lead 211 in the groove 300 and electrically connected to the first electrode 201. For example, the first electrode lead 211 may contact the first electrode 201 directly, and the first electrode lead 211 can lead out the common first electrode 201 of OLED devices to connect to a first power line which is described hereinafter. For example, an electrical connection can be achieved between the first electrode lead and the first power line by providing a via hole (not shown).

For example, as illustrated by FIG. 9A, as described above, the OLED device has the second electrode 203 opposite to the first electrode 201. For example, the first electrode lead 211 and the second electrode 203 can be formed by a same patterning process, for example, a same photolithographic patterning process.

In the present embodiment, the first electrode lead and the second electrode 203 can be formed by a same patterning process, thus saving process cost and mask cost.

At least one embodiment of the present disclosure further provides a manufacturing method of an electroluminescent display substrate, for example, as illustrated by FIG. 9A, the manufacturing method further includes forming a gate metal layer 401, a gate insulation layer 402 and a source drain metal layer 403 sequentially on the base substrate 100. For example, they can be formed by employing a sputtering process, a deposition process and a photolithography patterning process.

For example, as illustrated by FIG. 9A and FIG. 10 (FIG. 10 is a top plan view of a data driving side of the display substrate 10), the gate metal layer 401 includes data line leads 502, the first power line VSS and the second power line VDD, all of which are formed in the peripheral area 102, in addition to the gate electrode 411 of the driving transistor described above. For example, the gate meal layer 401 can be formed by a sputtering process and a photolithography patterning process.

For example, as illustrated by FIG. 9A and FIG. 10, the source drain metal layer 403 includes data lines 501 formed in the peripheral area, in addition to the third electrode 412 and the fourth electrode 413 of the driving transistor described above. For example, the source drain metal layer 403 can be formed by a sputtering process and a photolithography patterning process.

For example, as illustrated by FIG. 9A and FIG. 10, the gate insulation layer 402 has at least one via hole (for example, a plurality of via holes) exposing the data line leads in the peripheral area 102. The data lines 501 formed in the source drain metal layer 403 can be routed to the data line leads 502 disposed in the gate metal layer 401 through the via holes 505.

For example, As illustrated by FIG. 9A and FIG. 10, a plurality of via holes 505 and the data lines 501 are disposed on a side of the groove 300 facing the display area 101, and the data line leads 502 are electrically connected to the data lines 501 through the via holes 505 after crossing the groove 300.

For example, as illustrated by FIG. 9A, the display substrate further includes a passivation layer 404, which covers the source drain metal layer 403.

For example, as illustrated by FIG. 9B, when the groove 300 penetrates through the pixel defining layer 204 and the insulation layer 205, if the data line 501 of the source drain metal layer 403 is not routed to the data line lead 502 of the gate metal layer 401 through the via hole 505, the first electrode 201 located at the groove 300 is separated from the data line 501 by an insulating passivation layer 404.

In the embodiments of the present disclosure, as illustrated by FIG. 9A, the data line 501 disposed in the source drain metal layer 403 is routed to the data line lead 502 disposed in the gate metal layer 401 through the via hole 505, and the data line lead 502 lead out the data line 501, so that the first electrode 201 located at the groove 300 and the data line lead 502 are separated by a two-layer insulating structure of the passivation layer 404 and the gate insulation layer 402, thus avoiding a risk of short circuit between the first electrode 201 and the data line lead 502 effectively.

For example, as illustrated by FIG. 10, one end of the first power line VSS is connected to the data drive circuit 500, and the other end thereof is connected to the first electrode lead 211 described above, thus supplying a voltage signal to the first electrode 201. For example, one end of the second power line VDD is connected to the data drive circuit 500, and the other end thereof is connected to one electrode (for example, a source electrode or a drain electrode) of the driving transistor described above, thus supplying a drive voltage to the driving transistor.

For example, as illustrated by FIG. 10, after being led out from the display area 101, the data lines 501 are in a fan-shaped arrangement upon crossing the second power line VDD, which is referred to as a first fan-shaped arrangement 601. Because the data lines 501 (data line leads 502), the first power line VSS and the second power line VDD are finally connected to the data drive circuit 500, disposing the first fan-shaped arrangement 601 can keep the data lines 501 away from a connection region of the first power line VSS and the data drive circuit 500 and a connection region of the second power line VDD and the data drive circuit 500.

For example, as illustrated by FIG. 10, after crossing the second power line VDD in the fan-shaped arrangement, the data lines 501 crosses the first power line VSS in a parallel arrangement. Then the data lines 501 are electrically connected to the data line leads 502 through the via holes after crossing the first power line VSS, that is, the data lines 501 are routed to the data line leads through the via holes.

For example, as illustrated by FIG. 10, portions of the data line leads 502 crossing the groove 300 are in a fan-shaped arrangement, which is referred to as a second fan-shaped arrangement 602. Disposing the second fan-shaped arrangement 602 can make the data line leads 502 be fanned out in a better way to be connected to the data drive circuit 500.

It should be noted that, descriptions for the data lines 501, the first fan-shaped arrangement 601, the data line leads 502, the second fan-shaped arrangement 602, the first power line VSS and the second power line VDD, may be referred to the corresponding descriptions for the electroluminescent display substrate provided by the embodiments of the present disclosure, and details are not described herein again.

In the embodiments of the present disclosure, the first power line VSS and the second power line VDD are disposed in the gate metal layer, while the data lines ate disposed in the source drain metal layer, so the data lines are in a wire-climbing-surface design when crossing the first power line VSS and the second power line VDD. Metal ramps are fewer in the wire-climbing-surface design, thus reducing a risk of shirt circuit between the two metal layers. At the same time, the two fan-shaped arrangement (the first fan-shaped arrangement and the second fan-shaped arrangement) can make the data lines be fanned out in a better way to be connected to the data drive circuit.

In summary, the electroluminescent display substrate and the manufacturing method thereof, the display panel and the display apparatus, provided by the embodiments of the present disclosure, have at least one of the following beneficial effects:

(1) In at least one embodiment of the present disclosure, by disposing a groove in a pixel defining layer in a peripheral area and covering the groove with a first electrode, the oxygen, the water vapor, etc. can be effectively prevented from infiltrating into the OLED device through the pixel defining layer, thus improving display performance and stability of the display panel including the electroluminescent display substrate, and prolonging the service life of the display panel.

(2) In at least one embodiment of the present disclosure, by disposing a groove in a pixel defining layer and a insulation layer in a peripheral area and covering the groove with a first electrode, the oxygen, the water vapor, etc. can be effectively prevented from infiltrating into the OLED device through the pixel defining layer, thus improving display performance and stability of the display panel including the electroluminescent display substrate, and prolonging the service life of the display panel.

(3) In at least one embodiment of the present disclosure, a first electrode lead and a second electrode can be formed by a same patterning process, thus saving process cost and mask cost.

(4) In at least one embodiment of the present disclosure, data lines are routed to data line leads through via holes, thus avoiding a risk of short circuit between the first electrode and the data line leads effectively.

(5) In at least one embodiment of the present disclosure, the data lines are in a wire-climbing-surface design when crossing a first power line VSS and a second power line VDD, thus reducing a risk of short circuit between metal layers.

(6) In at least one embodiment of the present disclosure, two fan-shaped arrangements (a first fan-shaped arrangement and a second fan-shaped arrangement) can make the data lines be fanned out in a better way to be connected to a data drive circuit.

For the disclosure, the following statements should be noted:

(1) The accompanying drawings involve only the structure(s) in connection with the embodiments of the present disclosure, and other structure(s) can be referred to common design(s).

(2) For the purpose of clarity only, in accompanying drawings for illustrating the embodiments of the present disclosure, the thickness and size of a layer or a structure may be enlarged or narrowed, that is, the drawings are not drawn in a real scale.

(3) In case of no conflict, features in one embodiment or in different embodiments can be combined.

The foregoing is only specific implementations of the present disclosure, but the protection scope of the present disclosure is not limited thereto. Therefore, the protection scope of the present disclosure should be based on the protection scope of the claims.

What is claimed is:

1. An electroluminescent display substrate, comprising:
a base substrate comprising a display area and a peripheral area surrounding the display area, wherein at least one OLED device is in the display area;
a pixel defining layer in the display area and the peripheral area; and
at least one groove in the pixel defining layer in the peripheral area,
wherein the at least one OLED device has a first electrode, the first electrode is on a side of the pixel defining layer away from the base substrate and extends to cover the at least one groove,
the electroluminescent display substrate further comprising: a gate metal layer, a gate insulation layer and a source drain metal layer sequentially disposed on the base substrate;
wherein the gate metal layer comprises data line leads in the peripheral area,
the source drain metal layer comprises data lines in the peripheral area,
the gate insulation layer has a plurality of via holes in the peripheral area to expose the data line leads,
the plurality of via holes and the data lines are on a side of the at least one groove facing the display area,
the data line leads cross the at least one groove and are electrically connected to the data lines through the plurality of via holes.

2. The electroluminescent display substrate according to claim 1, wherein the first electrode completely covers the at least one groove.

3. The electroluminescent display substrate according to claim 1, wherein the at least one OLED device comprises a plurality of OLED devices provided in the display area, and the first electrode is a common cathode of the plurality of OLED devices.

4. The electroluminescent display substrate according to claim 1, wherein each of the at least one groove penetrates through the pixel defining layer in a direction perpendicular to the electroluminescent display substrate.

5. The electroluminescent display substrate according to claim 1, further comprising: an insulation layer in the display area and the peripheral area and between the pixel defining layer and the base substrate;
wherein the insulation layer and the pixel defining layer are in contact with each other in the peripheral area,
each of the at least one groove comprises a first portion penetrating through the pixel defining layer in a direction perpendicular to the electroluminescent display substrate and a second portion in the insulation layer.

6. The electroluminescent display substrate according to claim 5, wherein the second portion of each of the at least one groove penetrates through the insulation layer in the direction perpendicular to the electroluminescent display substrate.

7. The electroluminescent display substrate according to claim 1, wherein a cross-sectional shape of each of the at least one groove in a direction parallel to the electroluminescent display substrate comprises at least one closed loop.

8. The electroluminescent display substrate according to claim 1, wherein a planar shape of each of the at least one groove comprises a straight strip, a curved strip or a wavy strip.

9. The electroluminescent display substrate according to claim 1, further comprising: a first electrode lead located in the at least one groove and electrically connected to the first electrode;
wherein the at least one OLED device has a second electrode opposite to the first electrode,
the first electrode lead and the second electrode are formed of a same material in a same layer.

10. The electroluminescent display substrate according to claim 1, further comprising: a first power line and a second power line in the peripheral area;
wherein the first power line, the second power line and the gate metal layer are formed of a same material in a same layer;
the data lines are in a fan-shaped arrangement upon crossing the second power line, so that the data lines extend outward to keep away from the first power line and the second power line, and a projection of parts of the data lines in the fan-shaped arrangement on the base substrate and a projection of the second power line on the base substrate are overlapped;
the data lines are in a parallel arrangement upon crossing the first power line, the data lines are electrically connected to the data line leads through the plurality of via holes after crossing the first power line, and a projection of parts of the data lines in the parallel arrangement on the base substrate and a projection of the first power line on the base substrate are overlapped;
the data line leads are in a fan-shaped arrangement upon crossing the at least one groove, so that the data line leads can keep away from the first power line and the second power line, and a projection of parts of the data line leads in the fan-shaped arrangement on the base substrate and a projection of the at least one groove on the base substrate are overlapped.

11. A display panel, comprising:
the electroluminescent display substrate according to claim 1;
an opposite substrate disposed opposite to the display substrate and assembled with the display substrate; and
a sealant bonding the display substrate and the opposite substrate together with each other, wherein the sealant is on a side of the at least one groove away from the display area.

12. The display panel according to claim 11, further comprising: a first conductive layer on a side of the opposite substrate facing the electroluminescent display substrate; wherein the first electrode is electrically connected to the first conductive layer; and
   column spacers between the electroluminescent display substrate and the opposite substrate, and s second conductive layer covering the first conductive layer and the column spacers;
   wherein the first electrode is electrically connected to the first conductive layer through the second conductive layer.

13. A display apparatus, comprising: the display panel according to claim 11.

14. A manufacturing method of an electroluminescent display substrate, comprising:
   providing a base substrate, comprising a display area and a peripheral area surrounding the display area;
   forming at least one OLED device in the display area;
   forming a pixel defining layer in the display area and the peripheral area; and
   forming at least one groove in the pixel defining layer in the peripheral area,
   wherein the at least one OLED device has a first electrode, the first electrode is on a side of the pixel defining layer away from the base substrate and extends to cover the at least one groove,
   the method further comprising:
   forming a gate metal layer, a gate insulation layer and a source drain metal layer sequentially on the base substrate;
   wherein the gate metal layer comprises data line leads, a first power line and a second power line in the peripheral area;
   the source drain metal layer comprises data lines in the peripheral area;
   the gate insulation layer has a plurality of via holes in the peripheral area to expose the data line leads, the plurality of via holes and the data lines are on a side of the at least one groove facing the display area;
   the data lines are in a fan-shaped arrangement upon crossing the second power line, so that the data lines extends outward to keep away from the first power line and the second power line, and a projection of parts of the data lines in the fan-shaped arrangement on the base substrate and a projection of the second power line on the base substrate are overlapped;
   the data lines are in a parallel arrangement upon crossing the first power line, the data lines are electrically connected to the data line leads through the plurality of via holes after crossing the first power line, and a projection of parts of the data lines in the parallel arrangement on the base substrate and a projection of the first power line on the base substrate are overlapped;
   the data line leads are in a fan-shaped arrangement upon crossing the at least one groove, so that the data line leads can keep away from the first power line and the second power line, and a projection of parts of the data line leads in the fan-shaped arrangement on the base substrate and a projection of the at least one groove on the base substrate are overlapped.

15. The method according to claim 14, wherein each of the at least one groove penetrates through the pixel defining layer in a direction perpendicular to the electroluminescent display substrate.

16. The method according to claim 14, further comprising:
   forming an insulation layer in the display area and the peripheral area and between the pixel defining layer and the base substrate,
   wherein the insulation layer and the pixel defining layer are in contact with each other in the peripheral area,
   each of the at least one groove comprises a first portion penetrating through the pixel defining layer in a direction perpendicular to the electroluminescent display substrate and a second portion in the insulation layer.

17. The method according to claim 16, wherein the second portion of each of the at least one groove penetrates through the insulation layer in the direction perpendicular to the electroluminescent display substrate.

18. The method according to claim 14, further comprising:
   forming a first electrode lead, which is covered by the first electrode, in the at least one groove;
   wherein the at least one OLED device has a second electrode opposite to the first electrode,
   the first electrode lead and the second electrode are formed by a same process.

* * * * *